US011776985B2

(12) United States Patent
Tsao et al.

(10) Patent No.: US 11,776,985 B2
(45) Date of Patent: Oct. 3, 2023

(54) METHOD OF FORMING SELF ALIGNED GRIDS IN BSI IMAGE SENSOR

(71) Applicant: Taiwan Semiconductor Manufacturing Co., Ltd., Hsin-Chu (TW)

(72) Inventors: Tsun-Kai Tsao, Tainan (TW); Jiech-Fun Lu, Madou Township (TW); Shih-Pei Chou, Tainan (TW); Wei Chuang Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 222 days.

(21) Appl. No.: 17/313,140

(22) Filed: May 6, 2021

(65) Prior Publication Data

US 2021/0280630 A1    Sep. 9, 2021

Related U.S. Application Data

(62) Division of application No. 16/364,450, filed on Mar. 26, 2019, now Pat. No. 11,031,434.
(Continued)

(51) Int. Cl.
*H01L 27/146*    (2006.01)

(52) U.S. Cl.
CPC .... *H01L 27/14685* (2013.01); *H01L 27/1463* (2013.01); *H01L 27/1464* (2013.01); *H01L 27/14623* (2013.01)

(58) Field of Classification Search
CPC ................. H01L 27/1463; H01L 27/1464
See application file for complete search history.

(56) References Cited

U.S. PATENT DOCUMENTS

2015/0061062 A1    3/2015   Lin et al.
2015/0311248 A1*   10/2015  Lee ................... H01L 27/14623
                                                              257/432
(Continued)

FOREIGN PATENT DOCUMENTS

CN    107845624 A    3/2018
CN    108666331 A    10/2018

OTHER PUBLICATIONS

Non-Final Office Action dated May 29, 2020 for U.S. Appl. No. 16/364,450.
(Continued)

*Primary Examiner* — Jay C Chang
*Assistant Examiner* — Mikka Liu
(74) *Attorney, Agent, or Firm* — Eschweiler & Potashnik, LLC

(57) ABSTRACT

A method of fabricating self-aligned grids in a BSI image sensor is provided. The method includes depositing a first dielectric layer over a back surface of a substrate that has a plurality of photodiodes formed therein, forming a grid of trenches, and filling in the trenches with dielectric material to create a trench isolation grid. Here, a trench passes through the first dielectric layer and extends into the substrate. The method further includes etching back dielectric material in the trenches to a level that is below an upper surface of the first dielectric layer to form recesses overlaying the trench isolation grid, and filling in the recesses with metallic material to create a metallic grid that is aligned with the trench isolation grid.

20 Claims, 17 Drawing Sheets

Related U.S. Application Data

(60) Provisional application No. 62/753,323, filed on Oct. 31, 2018.

(56) References Cited

U.S. PATENT DOCUMENTS

| | | |
|---|---|---|
| 2016/0276394 A1 | 9/2016 | Chou et al. |
| 2017/0062512 A1 | 3/2017 | Chou et al. |
| 2017/0077157 A1 | 3/2017 | Cheng et al. |
| 2017/0117309 A1* | 4/2017 | Chen .................. H01L 27/1463 |
| 2017/0278881 A1* | 9/2017 | Hsu .................. H01L 27/14623 |
| 2017/0373117 A1 | 12/2017 | Chou et al. |
| 2018/0151615 A1 | 5/2018 | Wen et al. |
| 2018/0151759 A1 | 5/2018 | Huang et al. |

OTHER PUBLICATIONS

Final Office Action dated Nov. 12, 2020 for U.S. Appl. No. 16/364,450.

Notice of Allowance dated Feb. 10, 2021 for U.S. Appl. No. 16/364,450.

\* cited by examiner

METHOD OF FORMING SELF ALIGNED GRIDS IN BSI IMAGE SENSOR

REFERENCE TO RELATED APPLICATIONS

This Application is a Divisional of U.S. patent application Ser. No. 16/364,450, filed on Mar. 26, 2019, which claims the benefit of U.S. Provisional Application No. 62/753,323, filed on Oct. 31, 2018. The contents of the above-referenced Patent Applications are hereby incorporated by reference in their entirety.

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates readout of the measurements. One type of image sensor commonly used in optical imaging devices is a back side illumination (BSI) image sensor. BSI image sensor fabrication can be integrated into conventional semiconductor processes for low cost, small size, and high integration. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
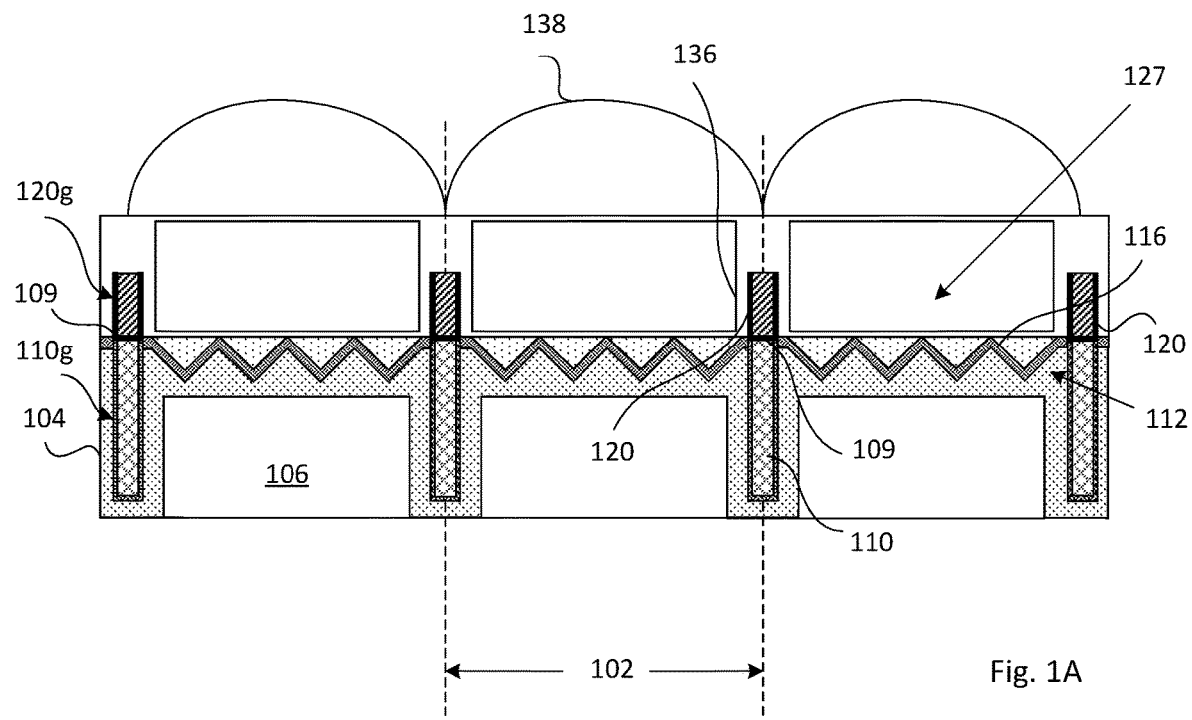
FIGS. 1A-1B are cross-sectional views of semiconductor structures for BSI pixel sensors in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Back side illumination (BSI) image sensors include an array of pixel sensors. Some semiconductor structures for the BSI image sensors include an integrated circuit having a semiconductor substrate and photodiodes corresponding to the pixel sensors arranged within the substrate. A back-end-of-line (BEOL) metallization stack of the integrated circuit underlies the semiconductor substrate along a first, front side of the semiconductor substrate. Color filters and micro lenses of the semiconductor structure correspond to the pixel sensors and are stacked in that order over the photodiodes of the corresponding pixel sensors on a second, back side of the semiconductor substrate.

When a BSI image sensor includes a trench isolation grid in the semiconductor substrate and a metal grid overlaying the trench isolation grid, optical isolation between neighboring pixel sensors can be improved. The trench isolation grid can be implemented by filling in deep trench isolation (DTI) regions that are arranged in the semiconductor substrate around and between the photodiodes. The metal grid can be implemented in a layer overlaying the semiconductor substrate and made in alignment with the trench isolation grid.

When the metal grid is fabricated in a dry etching process over a layer of oxide which overlays the semiconductor substrate, this dry etching process can cause silicon damages in the semiconductor substrate. Additionally, before the metal grid is fabricated, any dry etching process for thinning down the layer of oxide overlaying the semiconductor substrate can also cause silicon damages. In addition to the silicon damage problem, there is also the problem that the metal grid fabricated overlaying the layer of oxide may not be aligned with the trench isolation grid in the semiconductor substrate. In view of the forging, present disclosure is directed to a method for fabricating a BSI image sensor, in which the metal grid is self-aligned with the trench isolation grid and the fabrication of the metal grid does not involve silicon-damaging dry etching processes.

Figure 1B:
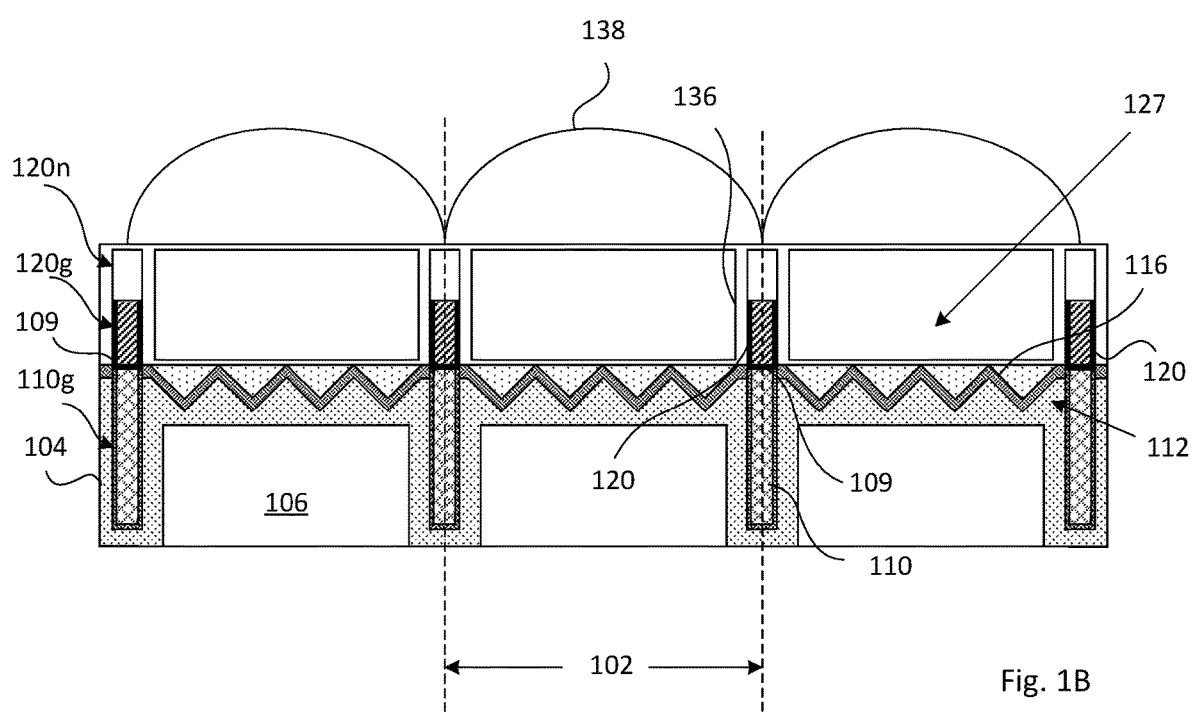

Each of FIGS. 1A-1B is a cross-sectional view of a semiconductor structure for BSI pixel sensors in accordance with some embodiments. In FIGS. 1A-1B, the pixel sensors 102 are typically arranged within a pixel sensor array of a BSI image sensor. The semiconductor structure includes a semiconductor substrate 104 within which photodiodes 106 corresponding to the pixel sensors 102 are arranged. The photodiodes 106 are arranged in rows and/or columns within the semiconductor substrate 104, and configured to accumulate charge (e.g., electrons) from photons incident on the photodiodes 106 from a backside of the semiconductor substrate 104. The semiconductor substrate 104 may be, for example, a bulk semiconductor substrate, such as a bulk silicon substrate, or a silicon-on-insulator (SOI) substrate.

In FIGS. 1A-1B, a deep trench isolation (DTI) region defines a trench isolation grid 110g, made up of grid segments, such as individual rectangles or squares which abut one another. Further, the DTI region extends into the semiconductor substrate 104 from a level that is about even with an upper surface of the substrate 104. The trench isolation grid 110g is laterally arranged around and between the photodiodes 106 to provide optical isolation between neighboring photodiodes 106. In some embodiments, the dielectric material for forming the trench isolation grid can be an oxide material, such as, silicon oxide (e.g., $SiO_2$) or hafnium oxide (e.g., $HfO_2$). In some embodiments, the dielectric material for forming the trench isolation grid can be a material that has a refractive index less than that of the substrate 104.

In FIGS. 1A-1B, a metallic grid 120g is formed over the trench isolation grid 110g. Metallic grid segments 120 in the metallic grid 120g are aligned with trench isolation grid segments 110 in the trench isolation grid 110g. In the pixel sensor 102 as shown in FIGS. 1A-1B, a metallic grid segment 120 is in direct contact with a corresponding trench isolation grid segment 110 at an interface 109 between the metallic grid segment 120 and the trench isolation grid segment 110. The cross section of a bottom of the metallic grid segment 120 at the interface 109 is identical to the cross section of a top of the trench isolation grid segment 110 at the interface 109. In some embodiments, the trench isolation grid 110g is a deep trench isolation grid. In some embodiments, the trench isolation grid 110g is a dielectric grid. In some embodiments, the trench isolation grid 110g can be a hybrid grid in which a hybrid grid segment includes both dielectric and metallic materials.

Because the metallic grid 120g directly contacts the trench isolation grid 110g at the interface 109, there is no buffer layer separating the metallic grid 120g and the trench isolation grid 110g. As a result, optical performance of the BSI pixel sensors 102 may be high. For example, optical performance may be increased by 4 lux or more compared BSI pixel sensors with 1000 angstrom oxide buffer layer. Additionally, as seen hereafter, the metallic grid 120g may be formed by a process devoid of dry etching. As a result, damage to the semiconductor substrate 104 may be low and white pixel counts may be low.

In the pixel sensor 102 as shown in FIGS. 1A-1B, a high absorption structure 112 is formed on the back surface of the substrate 104. The high absorption structure 112 is formed to reduce reflectance of the back surface of the substrate 104 when the photodiodes 106 are illuminated by light incident upon the back surface of the substrate 104. With the formation of the high absorption structure 112, more light is absorbed by the photodiode 106 in the pixel sensor 102. In some embodiments, the high absorption structure 112 has a saw-toothed profile or some other periodic pattern along the back surface of the semiconductor substrate 104. In some embodiments, the semiconductor substrate 104 has nanoporous silicon and/or some other high absorption semiconductor material at the high absorption structure 112. In some embodiments, a high-k dielectric material 116 lines the high absorption structure 112.

In FIGS. 1A-1B, the metallic grid segment 120 can have its interior region 127 opened up in the form of a rectangle, a square, or other designed shapes to accommodate additional components for the BSI pixel sensors. In the pixel sensor 102, a color filter 136 is placed in the interior region 127 of the metallic grid segment 120 in the metallic grid 120g. A micro lens 138 covering the color filter 136 is also placed in the interior region 127 of the metallic grid segment 120.

In the embodiments as shown in FIGS. 1A-1B, the color filters 136 for different pixel sensors 102 are separated from each other at least by the metallic grid 120g that includes individual metallic grid segments 120. In other embodiments, the color filters 136 for different pixel sensors 102 can be separated from each other by a composite grid. In some embodiments, as shown in FIG. 1B, the composite grid can include a metallic grid 120g and a low-n grid 120n overlaying the metallic grid 120g. The low-n grid 120n has a "low" refractive index relative to the color filters 136 to promote total internal reflection and hence to prevent radiation from passing between the pixel sensors 102. In some embodiments, the composite grid can include a metallic grid 120g, a low-n grid 120n, and a hard mask grid (not shown in figures) stacked in that order over the semiconductor substrate 104. As the metallic grid 120g in the composite grid is aligned with the trench isolation grid 110g in the substrate 104, the composite grid that separates different color filters can also be made to be aligned with the trench isolation grid 110g in the substrate 104.

Figure 2:
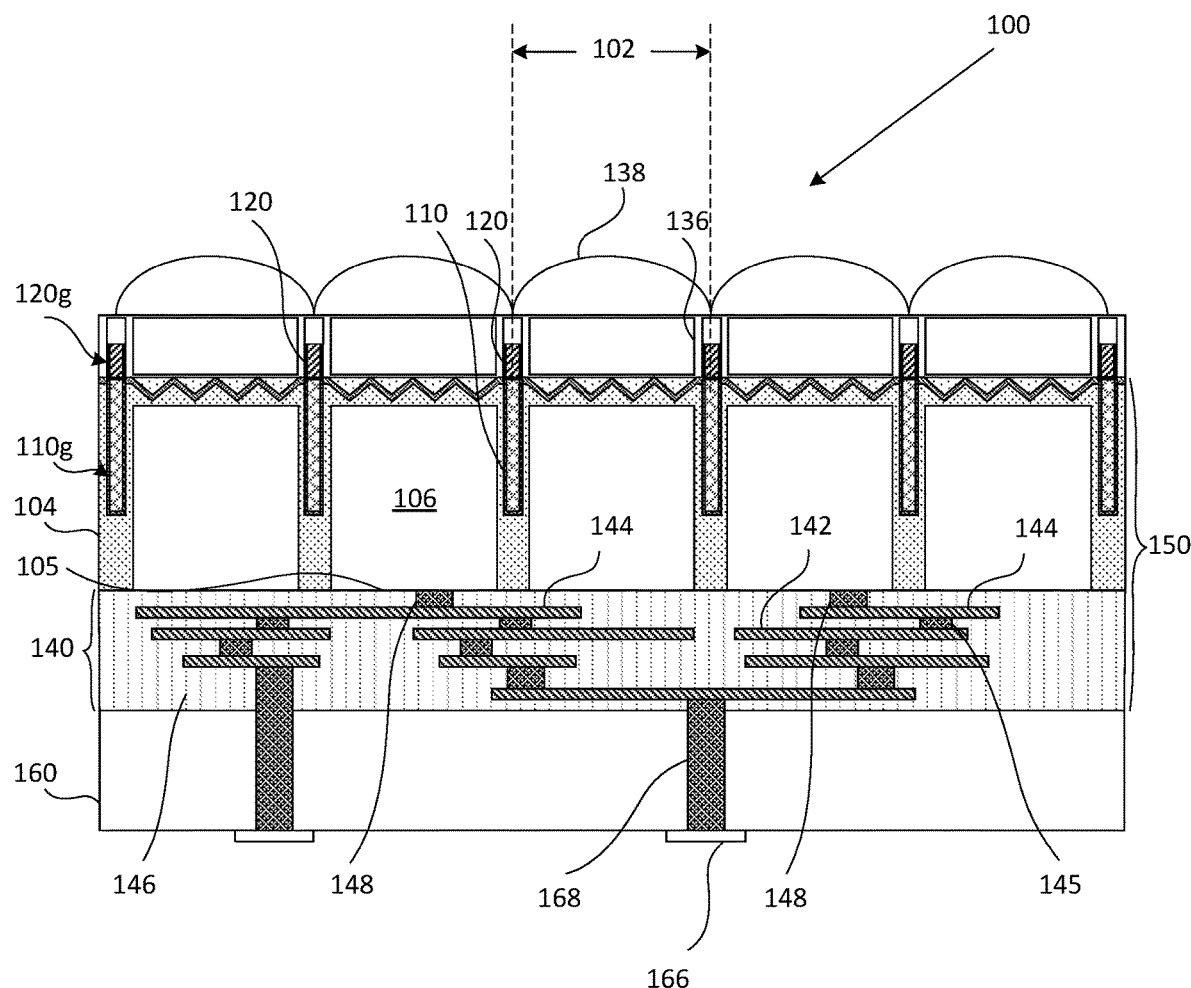
FIG. 2 is a cross-sectional view of a semiconductor structure for a BSI image sensor package in accordance with some embodiments.

FIG. 2 is a cross-sectional view of a semiconductor structure for a BSI image sensor package 100 in accordance with some embodiments. In FIG. 2, the BSI image sensor package 100 includes an array of pixel sensors 102 arranged in rows and columns on a back side of an integrated circuit 150. In some embodiments, the pixel sensor array includes the pixel sensors 102 in FIG. 1A or the pixel sensors 102 in FIG. 1B. In some embodiments, the pixel sensor array can include millions of pixel sensors arranged in hundreds or thousands of rows and hundreds or thousands of columns.

The integrated circuit 150 includes a semiconductor substrate 104, a back-end-of-line (BEOL) metallization stack 140, and a device region 105 located between the semiconductor substrate 104 and the BEOL metallization stack 140. The device region 105 is arranged along a surface of the semiconductor substrate 104, and extends into the semiconductor substrate 104. The device region 105 includes photodiodes 106 corresponding to the pixel sensors 102 and logic devices, such as transistors, for readout of the photodiodes 106. The photodiodes 106 are arranged in rows and columns within the semiconductor substrate 104, and configured to accumulate charge induced by the photons incident on the photodiodes 106. Further, the photodiodes 106 are optically isolated from each other by the trench isolation grid 110g in the semiconductor substrate 104, thereby reducing cross talk.

The BEOL metallization stack 140 of the integrated circuit 150 underlies the semiconductor substrate 104 and includes a plurality of metallization layers (e.g., 142, 144) stacked within an interlayer dielectric (ILD) layer 146. One or more contacts 148 of the BEOL metallization stack 140 extend from a metallization layer 144 to the device region 105. Further, one or more first vias 145 of the BEOL metallization stack 140 extend between the metallization layers (e.g., 142, 144) to interconnect the metallization layers (e.g., 142, 144). The ILD layer 146 may be, for example, a low-k dielectric (i.e., a dielectric with a dielectric constant less than about 3.9) or an oxide. The metallization layers (e.g., 142, 144), the contacts 148, and the first vias 145 may be, for example, a metal, such as copper or aluminum.

In FIG. 2, a carrier substrate 160 is bonded to the integrated circuit 150 with any one or combination of various suitable bonding techniques. One of the surfaces of the carrier substrate 160 can have a pad 166. The metallization layers (e.g., 142, 144) of the BEOL metallization stack 140 can be connected to the RDL 166 through one or more through substrate vias (TSVs) 168 extending through the carrier substrate 160. The TSVs 168 may, for example, be metal vias, silicon vias, or some other suitable vias. The metallization layers (e.g., 142, 144) of the BEOL metallization stack 140 can also be connected to an additional ASIC in the carrier substrate 160 through one or more vias extending into the carrier substrate 160.

Figure 3:
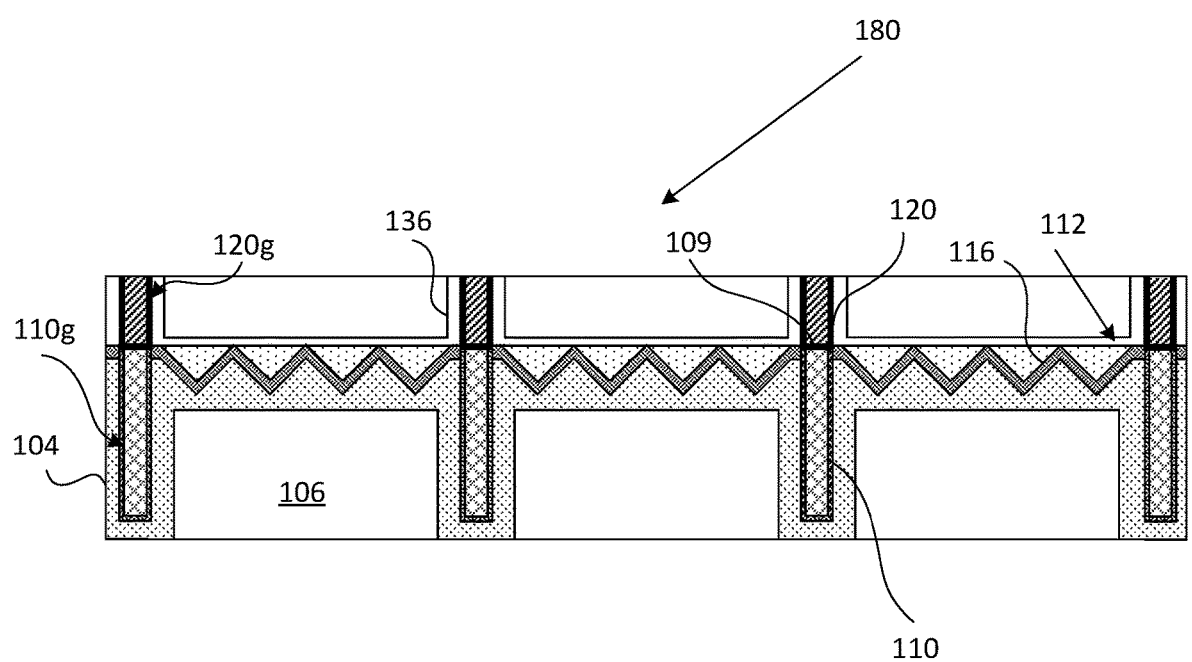
FIG. 3 is a cross-sectional view of a part of the semiconductor structure for BSI pixel sensors in FIGS. 1A-1B in accordance with some embodiments.

FIG. 3 is a cross-sectional view of a part of the semiconductor structure for BSI pixel sensors in FIGS. 1A-1B in accordance with some embodiments. In FIG. 3, the partial semiconductor structure 180 includes a substrate 104 in which photodiodes 106 are fabricated. A trench isolation grid 110g, which includes trench isolation grid segments 110, is embedded in the substrate 104. In FIG. 3, each of the photodiodes 106 as shown is laterally surrounded (when viewed top down) by a trench isolation grid segment 110. A metallic grid 120g having metallic grid segments 120 is formed over the trench isolation grid 110g. In FIG. 3, the metallic grid segment 120 is aligned with and in direct contact with its corresponding trench isolation grid segment 110 at an interface 109 between the metallic grid segment 120 and the trench isolation grid segment 110. The cross section of a bottom portion of the metallic grid segment 120 at the interface 109 is identical to the cross section of a top portion of the trench isolation grid segment 110 at the interface 109. In FIG. 3, a high absorption structure 112 is formed in at least a part of the back surface of the substrate. In some embodiments, a layer of high-k dielectric material 116 is formed overlaying the high absorption structure 112.

Figure 4:
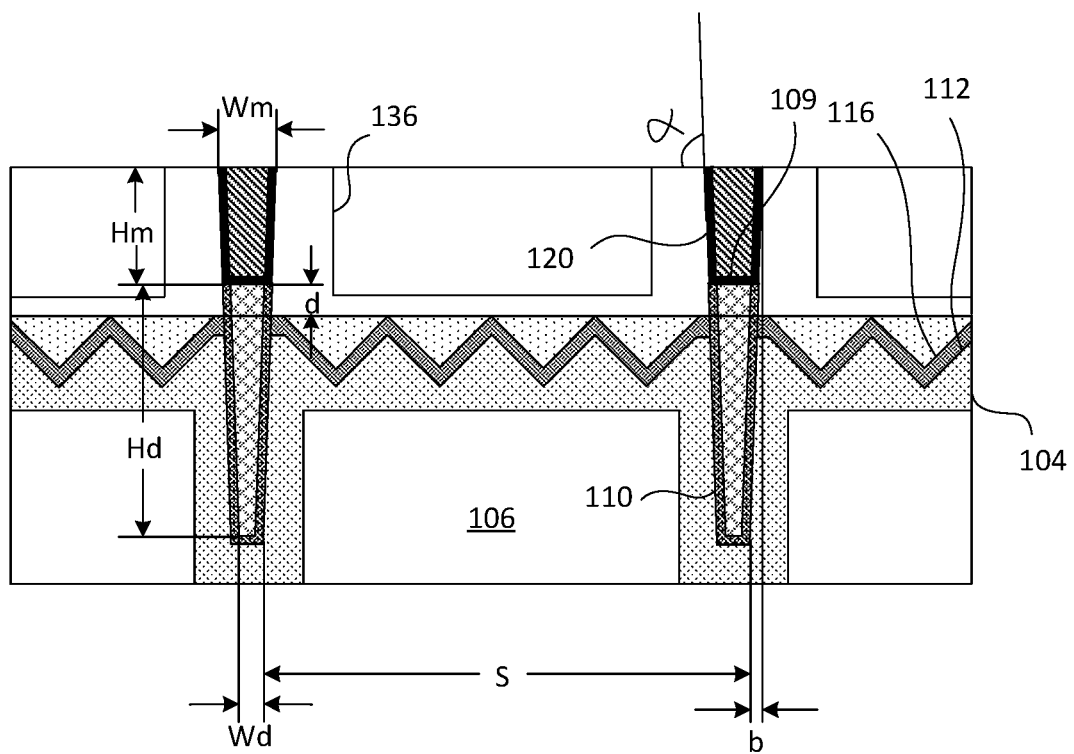
FIG. 4 illustrates the ranges of some dimensions in the partial semiconductor structure of FIG. 3 in accordance with some embodiments.

FIG. 4 illustrates the ranges of some dimensions in the partial semiconductor structure 180 of FIG. 3 in accordance with some embodiments. The trench isolation grid segment 110 can have a height "$H_d$" in a range from 1 um to 6 um. The metallic grid segment 120 can have a height "$H_m$" in a range from 600 nm to 1000 nm. The trench isolation grid segment 110 can have a width "$W_d$" in a range from 50 nm to 200 nm. The metallic grid segments 120 can have a width "$W_m$" in a range from 50 nm to 250 nm. Two of the trench isolation grid segments 110 can be separated by a separation "S" in a range from 700 nm to 2000 nm. The sidewall of the metallic grid segment 120 and the sidewall of the trench isolation grid segment 110 each can have a tilting angle "a" in a range from 85 to 95 degrees. The edge at the top of the metallic grid segment 120 and the edge at the bottom of the trench isolation grid segment 110 can be shifted by an amount "b" in a range from 0 to 50 nm. In FIG. 4, the interface 109 between the metallic grid segment 120 and the trench isolation grid segment 110 can be separated from the surface of high-k dielectric material 116 on the substrate 104. The distance "d" between the interface 109 and the surface of high-k dielectric material 116 can be in a range from −500 Å to +500 Å.

Figure 5A:
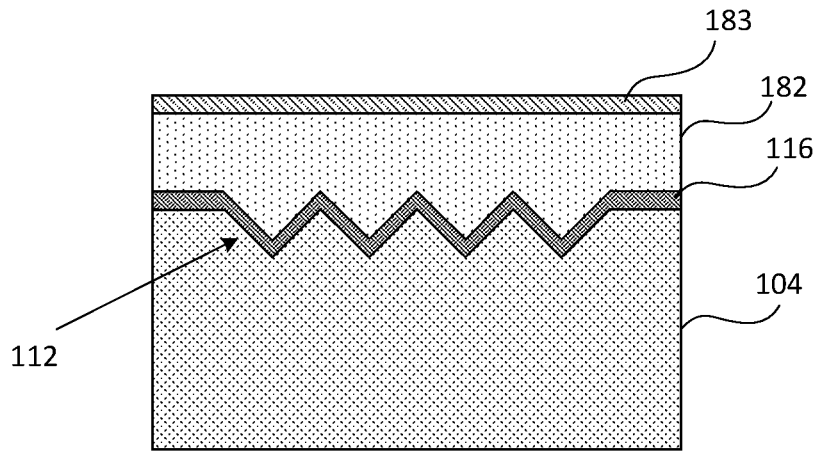
FIGS. 5A-5F are cross-sectional views of intermediate device structures for showing a process used in a method for fabricating the partial semiconductor structure of FIG. 3 in accordance with some embodiments.

FIGS. 5A-5F are cross-sectional views of intermediate device structures for showing a process used in a method for fabricating the partial semiconductor structure 180 of FIG. 3 in accordance with some embodiments. As shown in FIG. 5A, a substrate 104 with embedded photodiodes (not shown in figure) is provided. After, a high absorption structure 112 is formed in the back surface of the substrate 104 and a layer of high-k dielectric material 116 is deposited on the high absorption structure 112. Then, a first dielectric layer 182 is deposited on the layer of high-k dielectric material 116. After, the first dielectric layer 182 is planarized using a Chemical Mechanical Polishing (CMP) process and a silicon nitride capping layer 183 is deposited on the first dielectric layer 182. In FIG. 5A, examples of the high-k dielectric material 116 on the high absorption structure 112 includes aluminum oxide ($Al_2O_3$), hafnium oxide ($HfO_2$), and tantalum pentoxide ($Ta_2O_5$). The first dielectric layer 182 may be, for example, formed of an oxide, such as silicon dioxide ($SiO_2$).

Figure 5B:
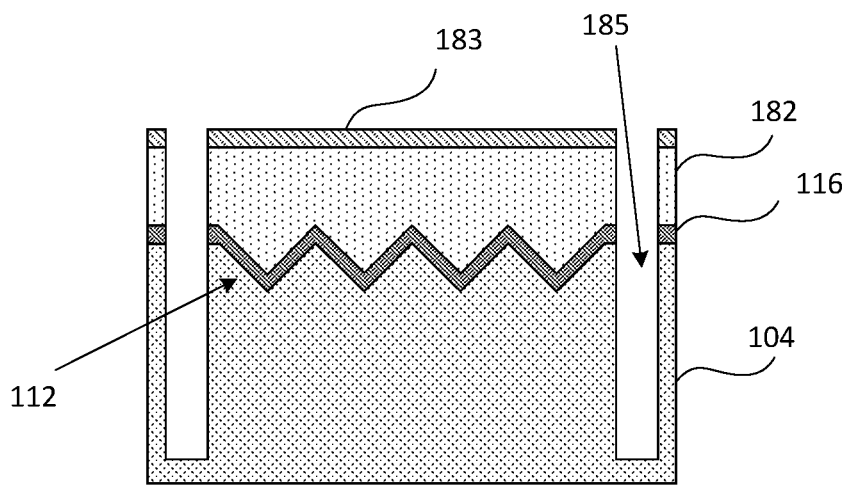

Next, as shown in FIG. 5B, trenches 185 are formed in the backside of the substrate 104. Patterns according to mask designs are formed in photoresists layer on top of the silicon nitride capping layer 183 by photolithography techniques. The silicon nitride capping layer 183 is then etched to form a mask pattern, followed by an etching process to form the trenches 185 that pass through the first dielectric layer 182 and extend into the substrate 104. In FIG. 5B, the trenches 185 can form a trench segment that laterally surrounds a photodiode when viewed top down (not shown in the figure).

Figure 5C:
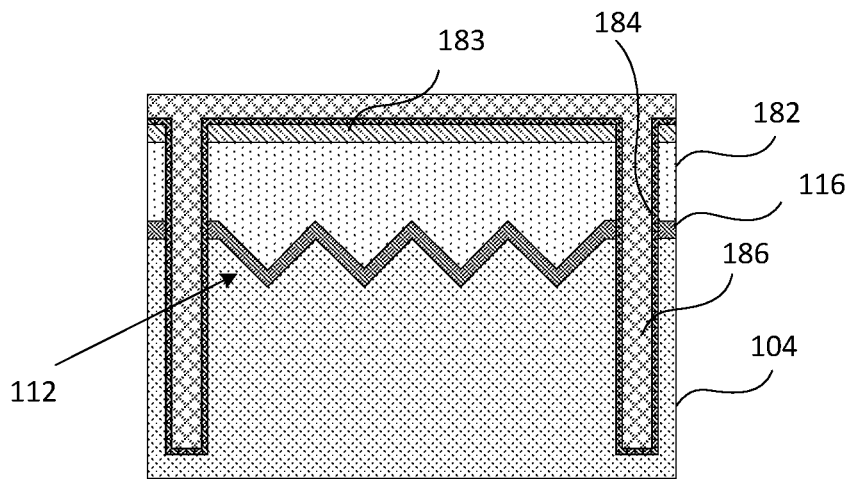

Next, as shown in FIG. 5C, the inner surfaces of the trenches 185 (see FIG. 5B) are lined with high-k dielectric material 184. Then, the trenches 185 are filled with dielectric material 186, such as, silicon oxide. Examples of the high-k dielectric material 184 coated on the inner surfaces of the trenches 185 includes aluminum oxide ($Al_2O_3$), hafnium oxide ($HfO_2$), and tantalum pentoxide ($Ta_2O_5$).

Figure 5D:
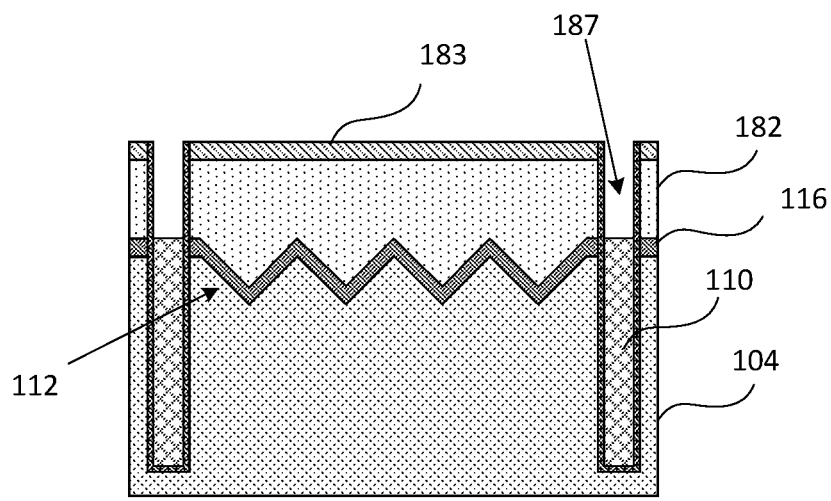

Next, as shown in FIG. 5D, the dielectric material 186 (e.g., silicon oxide) in the trenches 185 as shown in FIG. 5C is etched back to a level that is below an upper surface of the first dielectric layer 182 to form a recess 187. The dielectric material 186 remaining in the trenches 185 forms the trench isolation grid segments 110. The combination of the trench isolation grid segments 110 in multiple rows and columns can form the trench isolation grid 110g in FIG. 3.

Figure 5E:
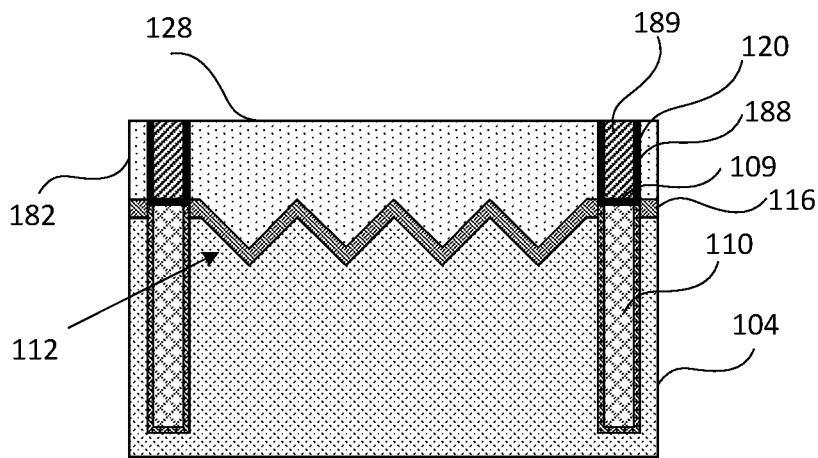

Next, as shown in FIG. 5E, the recess 187 in FIG. 5D is lined with a barrier layer 188 (e.g., a layer of tantalum nitride), followed by the deposition of metallic material 189 (e.g., tungsten) to fill up the recess 187. Possible selection of the materials for the barrier layer includes Ta, TaN, TiN, TiW, or their combinations. Then, a CMP process is used for planarization and for removing metallic material 189 on the silicon nitride capping layer 183 (see FIG. 5D) and removing the silicon nitride capping layer 183, to form a flat surface 128. The metallic material (e.g., tungsten) 189 filling up the recess 187 forms the metallic grid segment 120. The combination of the metallic grid segment 120 in multiple rows and columns can form the metallic grid 120g in FIG. 3.

Figure 5F:
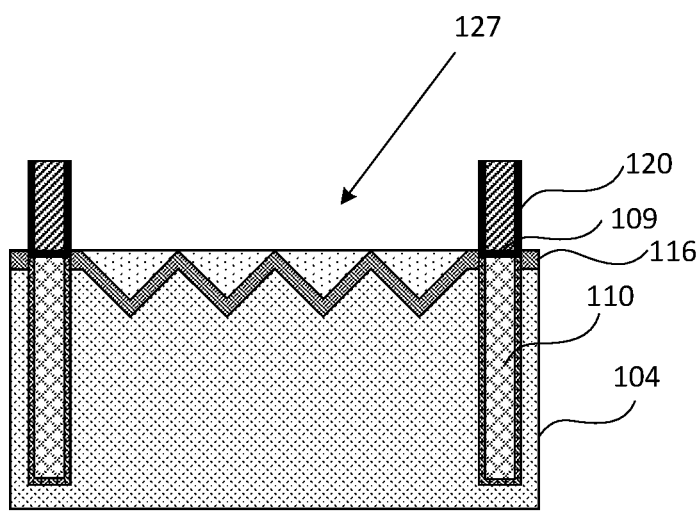

Next, as shown in FIG. 5F, the first dielectric layer 182 is etched back to remove at least part of the first dielectric layer 182 to expose some interior region 127 of the metallic grid segment 120. In some embodiments, the first dielectric layer 182 is etched back with a plasma-less gaseous chemical etching process (such as, the Certas etching process). In some embodiments, the first dielectric layer 182 is additionally or alternatively etched back with the Dilute Hydrofluoric Acid (DHF) dip process.

As seen above, a pattern of the trenches 185 (see FIG. 5B) is transferred to both the metal grid segments 120 and the trench isolation grid segments 110 by forming the metal grid segments 120 and the trench isolation grid segments 110 in the trenches 185. Accordingly, the metal grid segments 120 and the trench isolation grid segments 110 are self-aligned and there is no overlay error between the metal grid segments 120 and the trench isolation grid segments 110.

Further, the metal grid segments 120 may be formed without dry etching by using a deposition followed by a planarization. This prevents crystalline damage to the substrate 104 and hence reduces leakage current (e.g., dark current) and white pixels in the substrate 104. Further, while dry etching need not be used during formation of the trenches 185 and/or etch back of the dielectric material 186 (see FIG. 5D), it may be used. To the extent that dry etching is used during formation of the trenches 185 and/or etch back of the dielectric material 186, the silicon nitride capping layer 183 may protect the substrate 104 from damage and may hence further reduce leakage current and white pixels in the substrate 104.

Further yet, because dry-etch damage to the substrate 104 is mitigated, the metal grid segments 120 and the trench isolation grid segments 110 may be formed without an intervening buffer layer to protect the substrate 104. This enhances optical performance (e.g., sensitivity, signal-to-noise, etc.) of pixel sensors in the substrate 104.

Figure 6:
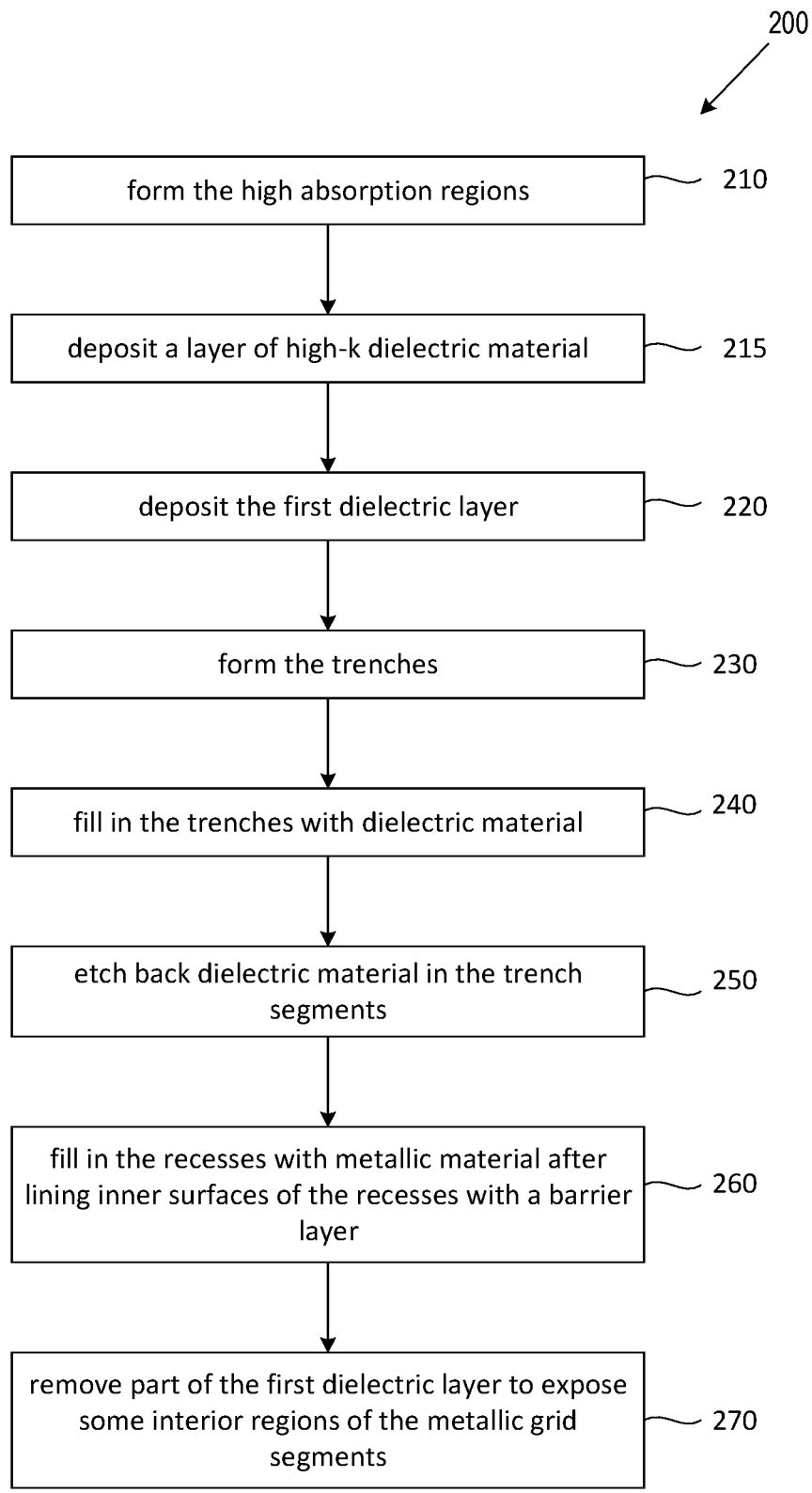
FIG. 6 is a flow chart showing a process used in a method for fabricating the partial semiconductor structure of FIG. 3 in accordance with some embodiments.

FIG. 6 is a flow chart showing a process used in a method 200 for fabricating the partial semiconductor structure 180 of FIG. 3 in accordance with some embodiments. The partial semiconductor structure is fabricated on a substrate with embedded photodiodes. In FIG. 6, at 210, high absorption regions are formed in parts of the back surface of the substrate. Then, at 215, a layer of high-k dielectric material is deposited, and at 220, the first dielectric layer is deposited. In some embodiments, as shown in FIG. 5A, the high absorption structure 112 is formed in the back surface of the substrate 104, the layer of high-k dielectric material 116 is deposited on the high absorption structure 112, and the first dielectric layer 182 is deposited on the layer of high-k dielectric material 116.

Next, at 230, the trenches are formed. The trenches formed at 230 passes through the first dielectric layer and extend into the substrate. In some embodiments, the trenches are formed by etching through the first dielectric layer and etching into the substrate according to the mask pattern in a layer of silicon nitride that covers the first dielectric layer. In some embodiments, as shown in FIG. 5B, the trenches 185 formed by an etching process passes though the first dielectric layer 182 and extends into the substrate 104.

Next, at 240, the trenches are filled with dielectric material, such as, silicon oxide. In some embodiments, as shown in FIG. 5C, the trenches 185 are filled with dielectric material 186 after the inner surfaces of the trenches 185 are lined with high-k dielectric material 184.

Next, at 250, the dielectric material in the trenches is etched back to a level that is below an upper surface of the first dielectric layer to form recesses in the trenches. In some embodiments, as shown in FIG. 5D, recesses 187 are formed in the trenches 185 after the dielectric material 186 as shown in FIG. 5C is etched back.

Next, at 260, the recesses are filled with metallic material after inner surfaces of the recesses are coated with a barrier layer. In some embodiments, as shown in FIG. 5E, the recesses 187 are filled with metallic material 189 after inner surfaces of the recesses 187 are coated with a barrier layer 188; in addition, a flat surface 128 is formed by removing excess materials with a CMP process.

Next, at 270, some parts of the first dielectric layer are removed. In some embodiments, as shown in FIG. 5F, some parts of the first dielectric layer 182 are removed to expose some interior region 127 of the metallic grid segment 120.

FIGS. 7A-7J are cross-sectional views of intermediate device structures for showing some example steps for fabricating a BSI image sensor when the process for fabricating self-aligned metallic grids are combined with additional steps in accordance with some embodiments. The process for fabricating self-aligned metallic grid can be the process as shown by the flow chart in FIG. 6 or the process as shown by the cross-sectional views of intermediate device structures in FIGS. 5A-5F.

Figure 7A:
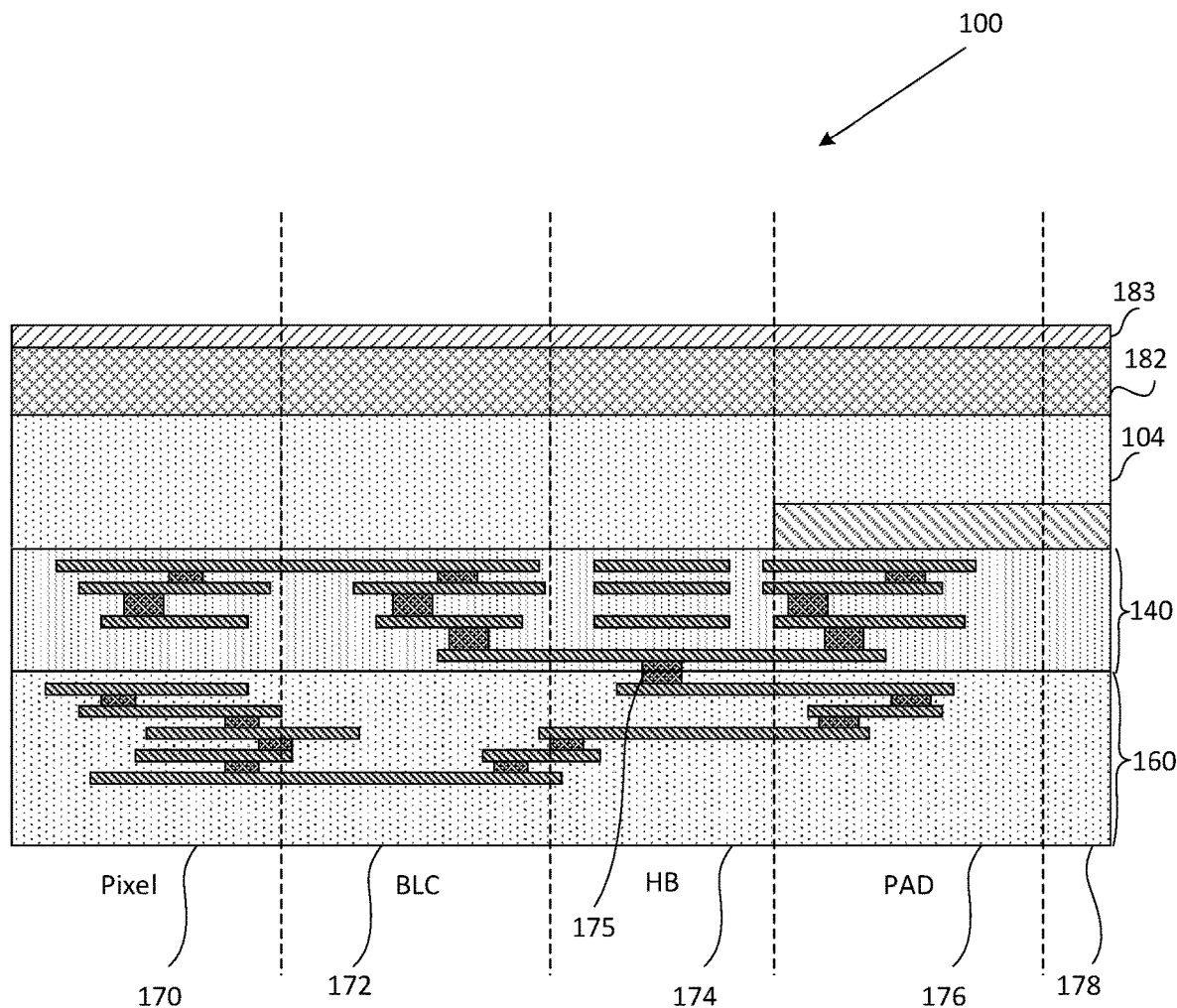
FIGS. 7A-7J are cross-sectional views of intermediate device structures for showing some example steps for fabricating a BSI image sensor when the process for fabricating self-aligned metallic grids are combined with additional steps in accordance with some embodiments.

In FIG. 7A, a substrate 104 with embedded photodiodes (not shown in figure) is provided. The photodiodes are implemented to receive light from the back side of the substrate 104. The front side of the substrate 104 is covered with metallization stack 140, which can includes a plurality of metallization layers stacked within an interlayer dielectric layer. The substrate 104 along with the metallization stack 140 is bonded to a carrier substrate 160. The carrier substrate 160 can include an additional ASIC and associated metallization stack. The metallization stack 140 can be connected to the additional ASIC in the carrier substrate 160 through various metallic contacts 175 at the interface between the metallization stack 140 and the carrier substrate 160.

In FIG. 7A, the BSI image sensor package 100 is implemented in a bonded structure that includes the substrate 104, the metallization stack 140, and the carrier substrate 160. Various regions in the bonded structure are implemented with various functional structures. For example, the array of pixel sensors is implemented in pixel region 170. Black Level Calibration (BLC) circuitry is implemented in BLC region 172. The metal bonding for various metallic contacts 175 alone with some non-metal bonding (e.g., dielectric-to-dielectric bonding) can be formed with Hybrid Bonding (HB) at the interface between the metallization stack 140 and the carrier substrate 160. Such Hybrid Bonding can be found in HB region 174. Various contact pads for the BSI image sensor package 100 can be implemented in PAD region 176. A Scribe Line (SL) can be implemented in SL region 178.

In FIG. 7A, in the process for fabricating the self-aligned metallic grid, a first dielectric layer 182 is deposited overlaying the substrate 104. A silicon nitride capping layer 183 is deposited on the first dielectric layer 182, after the first dielectric layer 182 is planarized using a CMP process. In some embodiments, a layer of high-k dielectric material 116 can be deposited between the first dielectric layer 182 and the substrate 104. In some embodiments, a high absorption structure 112 is formed in the back surface of the substrate 104, the layer of high-k dielectric material 116 is deposited on the high absorption structure 112, and the first dielectric layer 182 is deposited on the layer of high-k dielectric material 116.

Figure 7B:
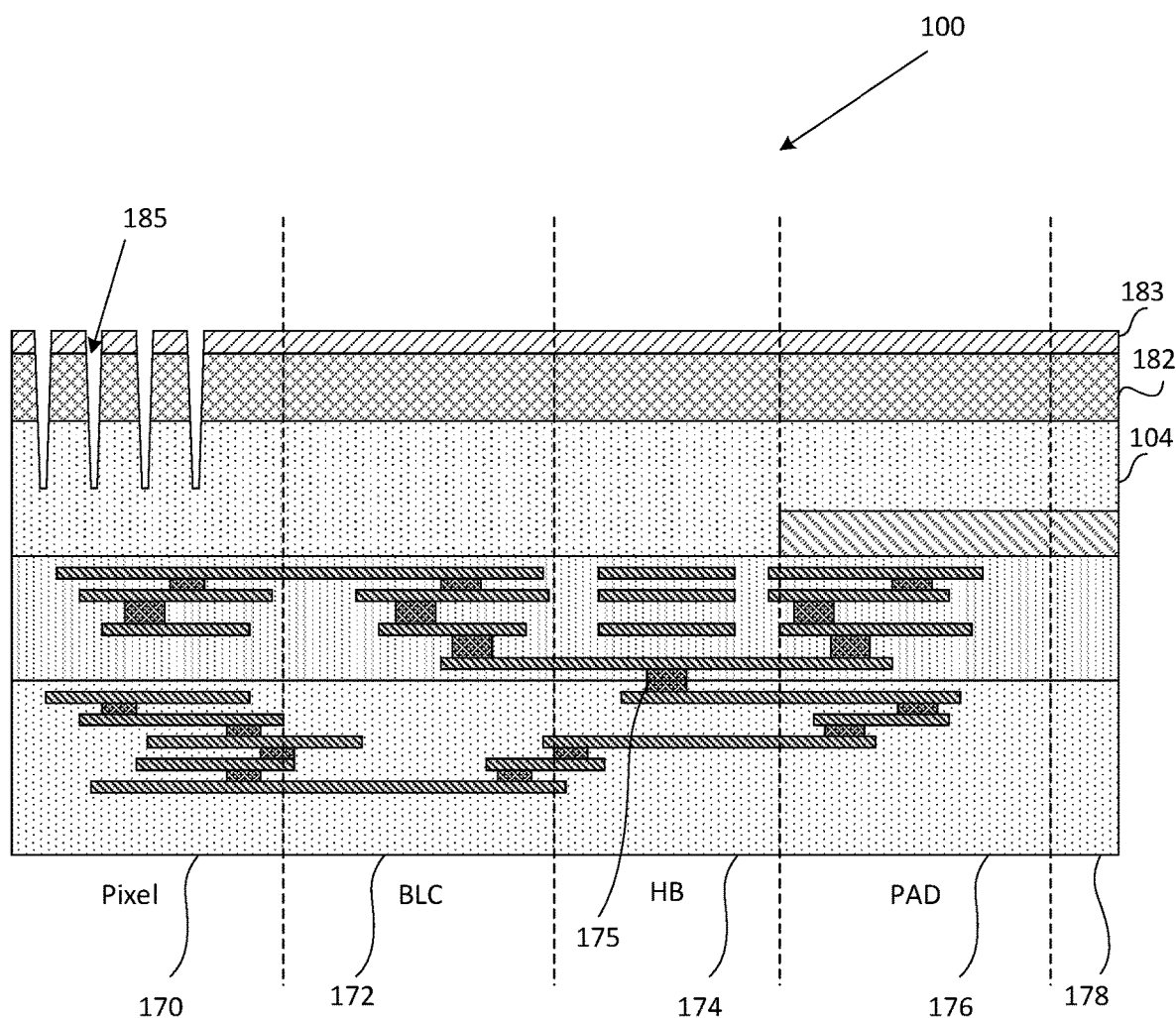
Figure 7C:
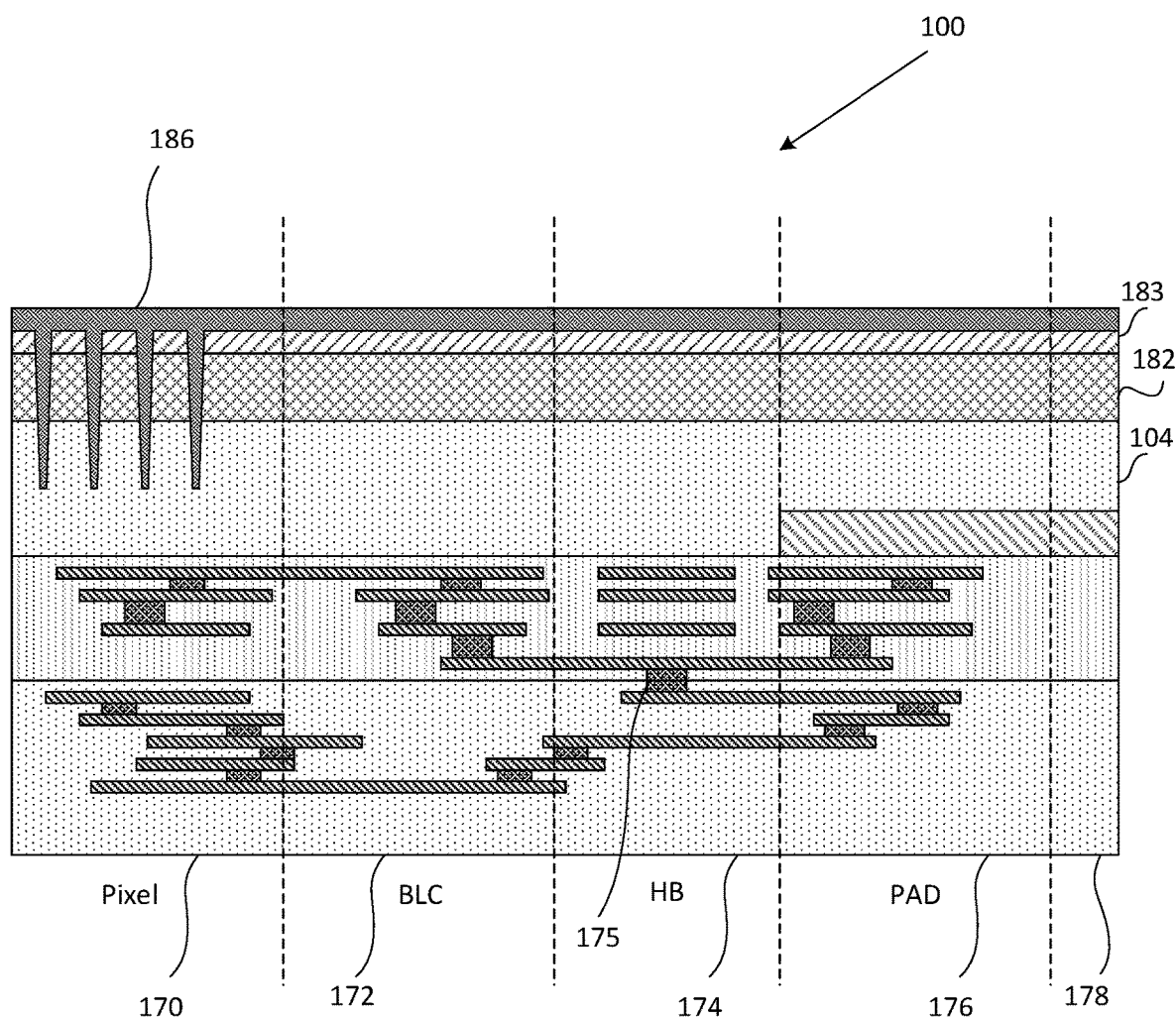

In FIG. 7B, trenches 185 are formed in the backside of the substrate 104. The trench segment laterally surrounding a photodiode can be formed by some combination of the trenches 185. The trenches 185 pass though the first dielectric layer 182 and extend into the substrate 104. In FIG. 7C, the inner surfaces of the trenches 185 (see FIG. 7B) are lined with high-k dielectric material 184 (not shown). Then, the trenches 185 are filled with dielectric material 186, such as, oxide materials.

Figure 7D:
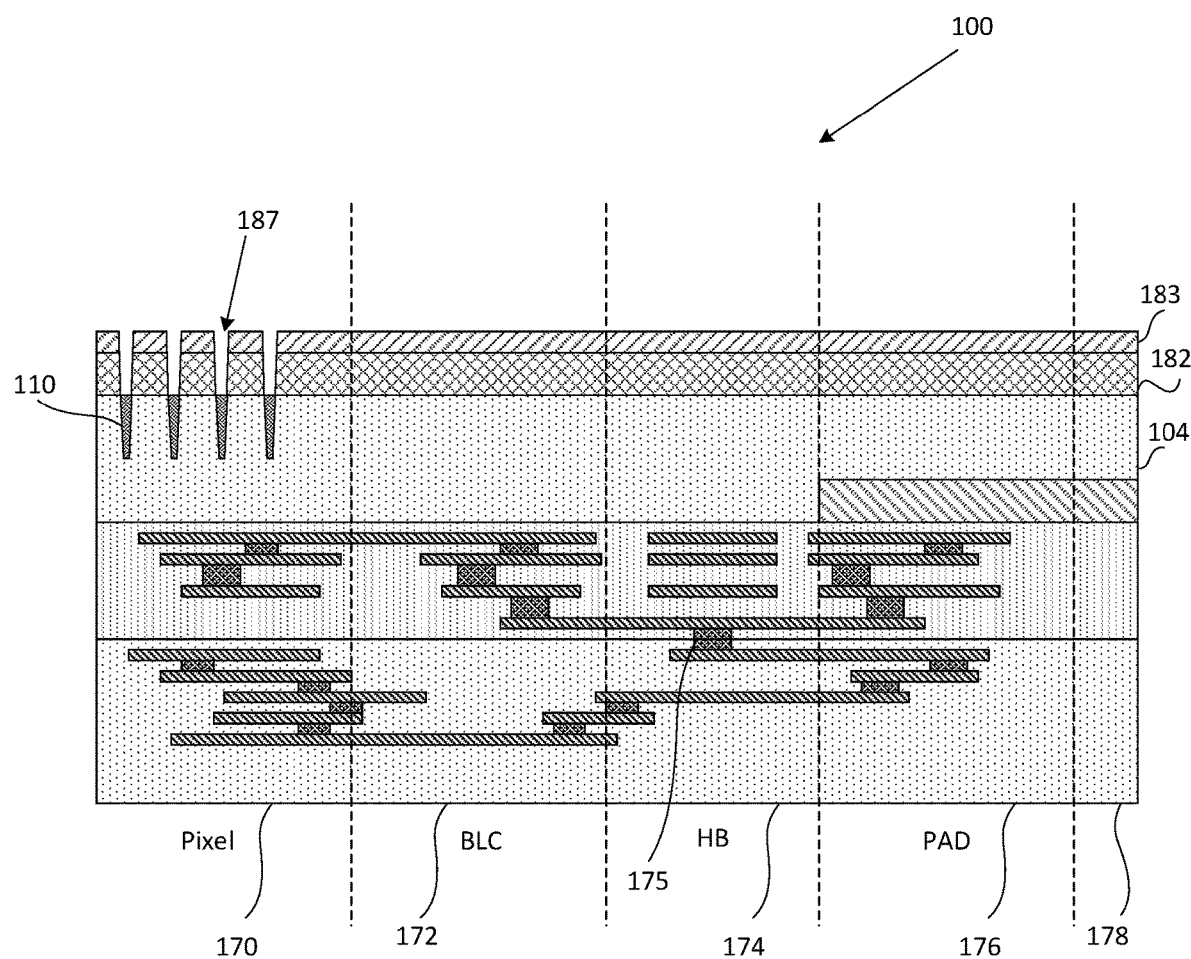

In FIG. 7D, the dielectric material 186 in the trenches 185 is etched back to a level that is below an upper surface of the first dielectric layer to form a recess 187. The dielectric material 186 remaining in the trenches 185 forms the trench isolation grid segments 110.

Figure 7E:
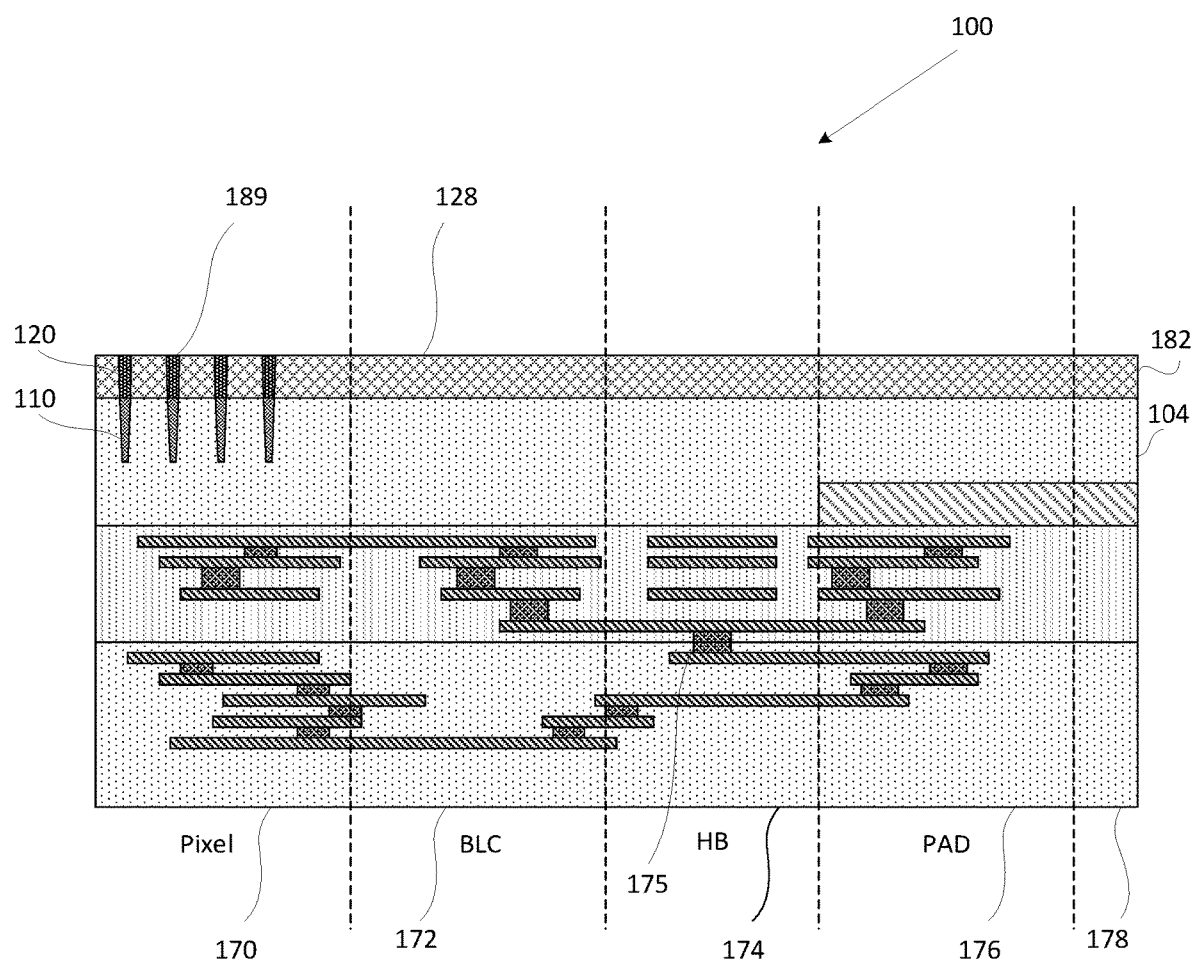

In FIG. 7E, the recess 187 in FIG. 7D is lined with a barrier layer (not shown in the figure), followed by the deposition of metallic material 189 to fill up the recess 187. Then, a CMP process is used for planarization and for removing excess materials, to form a flat surface 128. The metallic material 189 filling up the recess 187 forms the metallic grid segments 120.

After the fabrication of the trench isolation grid and the metallic grid in a process as shown in FIG. 7A-7E, various other structures in the BSI image sensor package 100 are fabricated in additional compatible processes. An example of such compatible processes is shown with reference to FIG. 7F-7J.

Figure 7F:
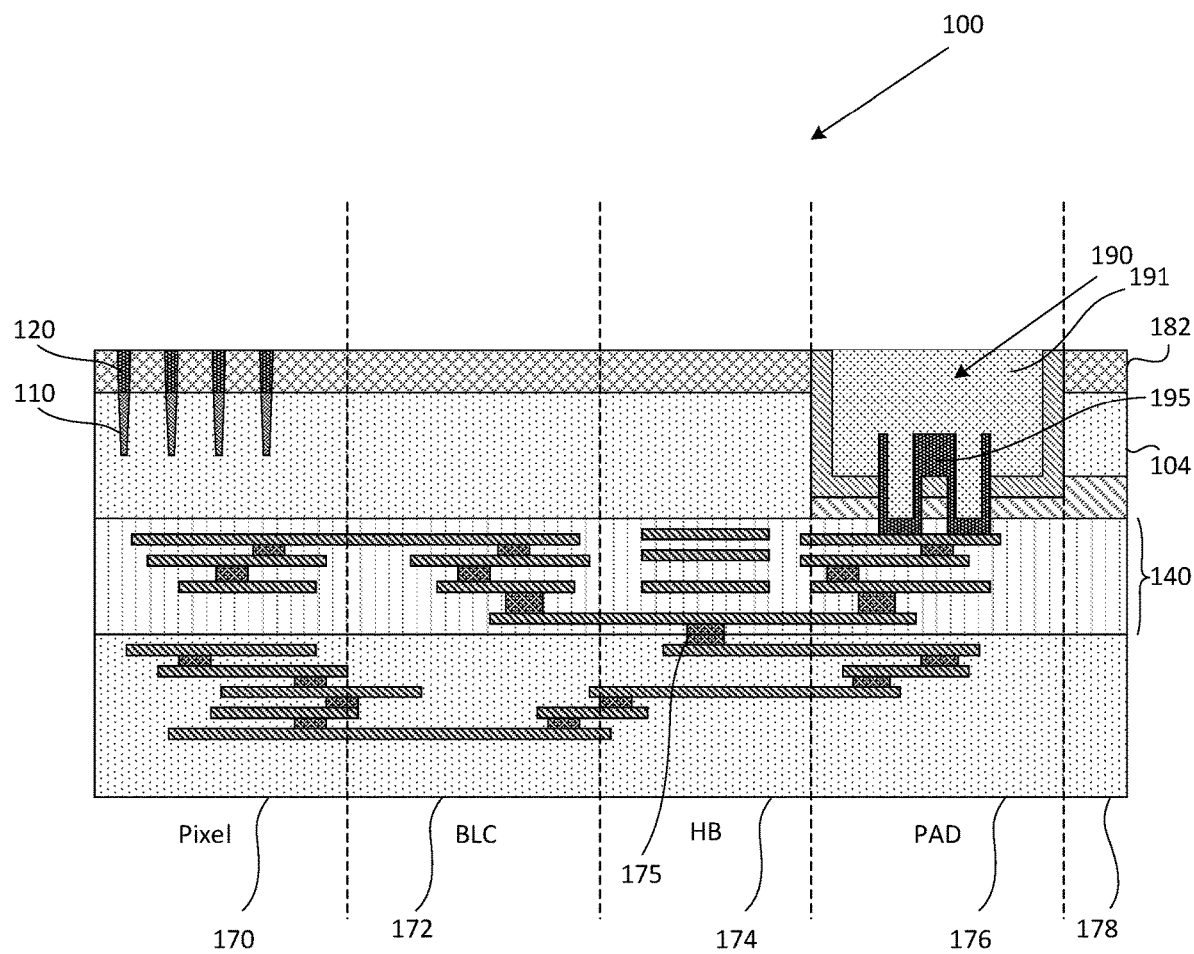

In FIG. 7F, after the fabrication of the device structure as shown in FIG. 7E, contact pads 190 are fabricated. One of the contact pads 190 is shown in FIG. 7F with some details. The contact pad 190 in FIG. 7F can include a top metal contact 195 which is conductively connected to one or more metallization layers in the metallization stack 140. The top metal contact 195 is covered with insulation material (e.g., oxide) 191 after the top surface of the device structure in FIG. 7F is finished with CMP planarization and the removal of excess materials.

Figure 7G:
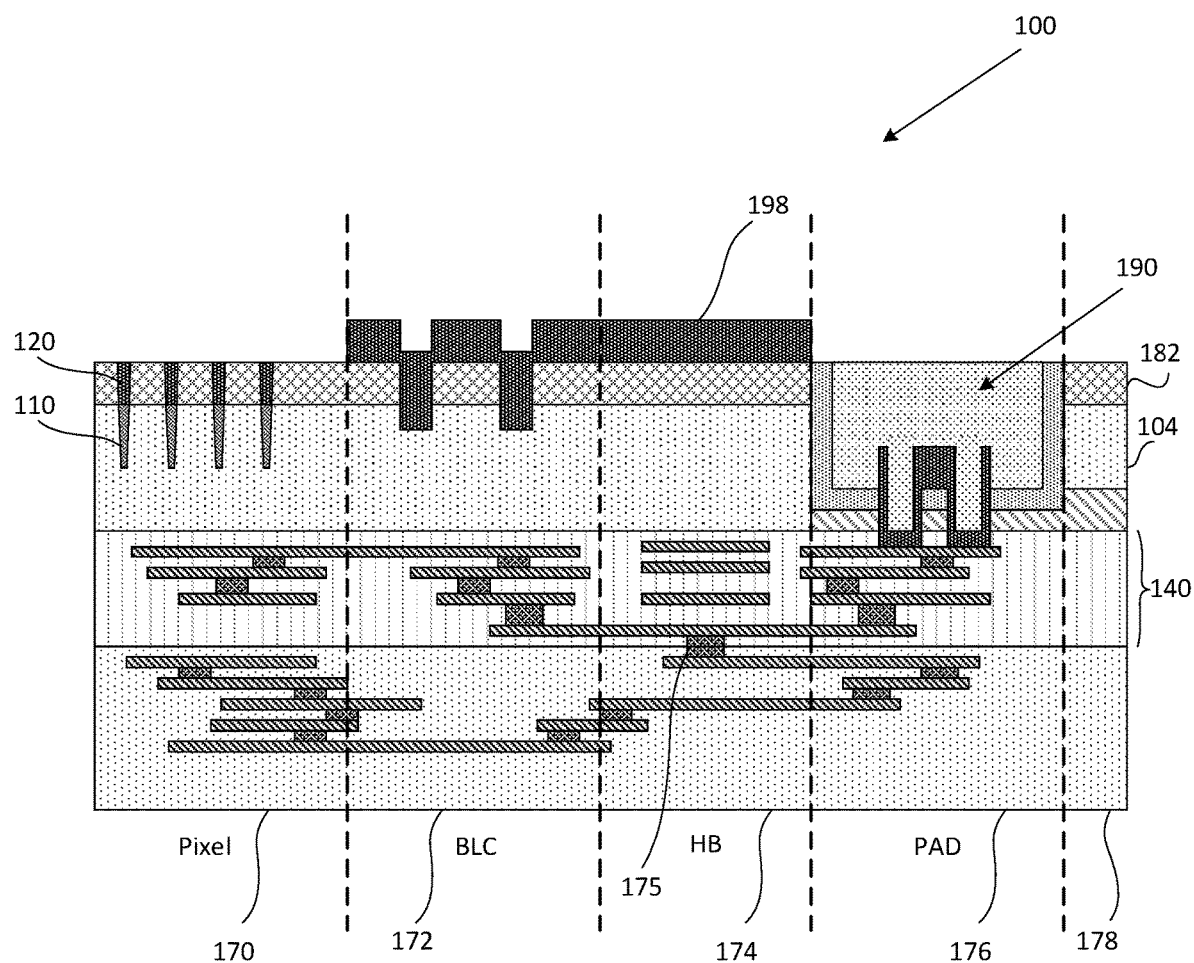
Figure 7H:
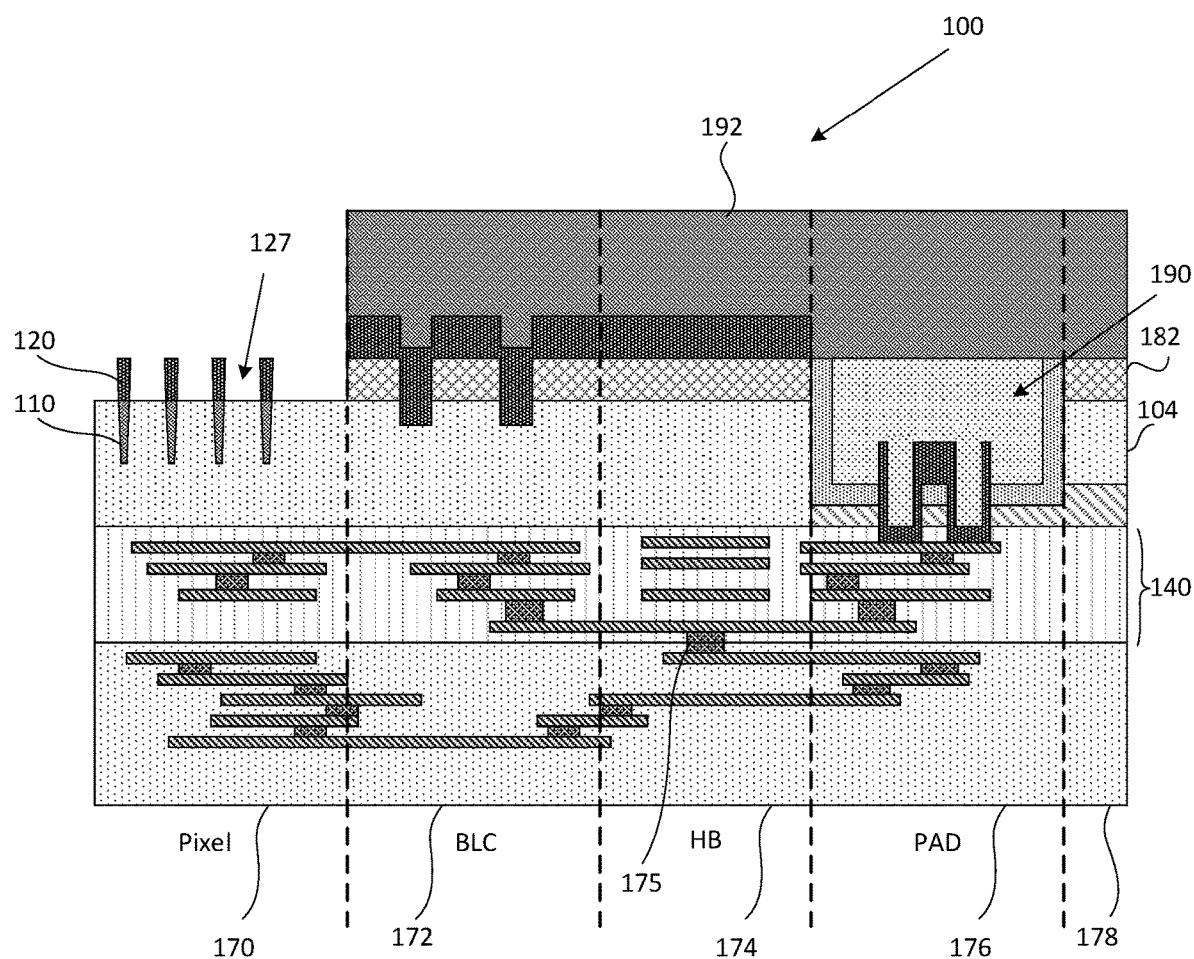

In FIG. 7G, after the fabrication of the device structure as shown in FIG. 7F, backside metal grid connections 198 are fabricated on the top surface of the device structure. Then, as shown in FIG. 7H, after a photolithography process, photoresists in the pixel region 170 are removed while the BLC region 172, the HB region 174, PAD region 176, and the SL region 178 are all covered with photoresists 192. Next, in the pixel region 170, the first dielectric layer 182 is etched back to remove parts of the first dielectric layer 182 to expose some interior regions 127 of the metallic grid segments 120. In the pixel region 170, the first dielectric layer 182 can be etched back with a Dilute Hydrofluoric Acid (DHF) dip process or with a plasma-less gaseous chemical etching process.

Figure 7I:
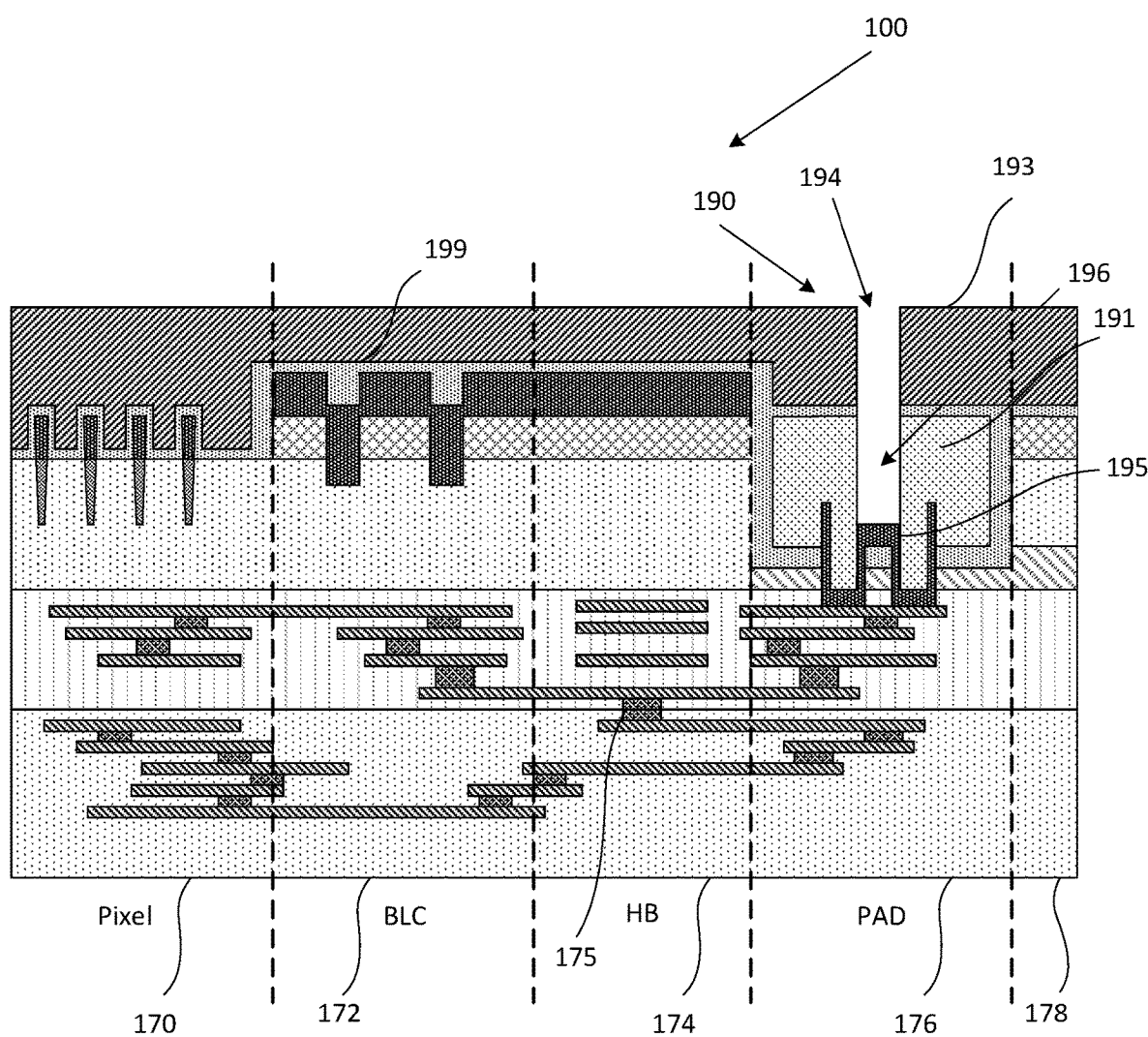

After the fabrication of the device structure as shown in FIG. 7H, a passivation layer 199 is deposited. In the embodiment as shown in FIG. 7I, the passivation layer 199 covers the top surface of the device structure in the pixel region 170, the BLC region 172, and the HB region 174. Then, a photoresists mask pattern 194 is formed in a layer of photoresists 193, followed by an etching process to etch through selected parts in the insulation material (e.g., oxide) 191 to form the contact opening 196 that exposes the surface of the top metal contact 195 of the contact pad 190.

Figure 7J:
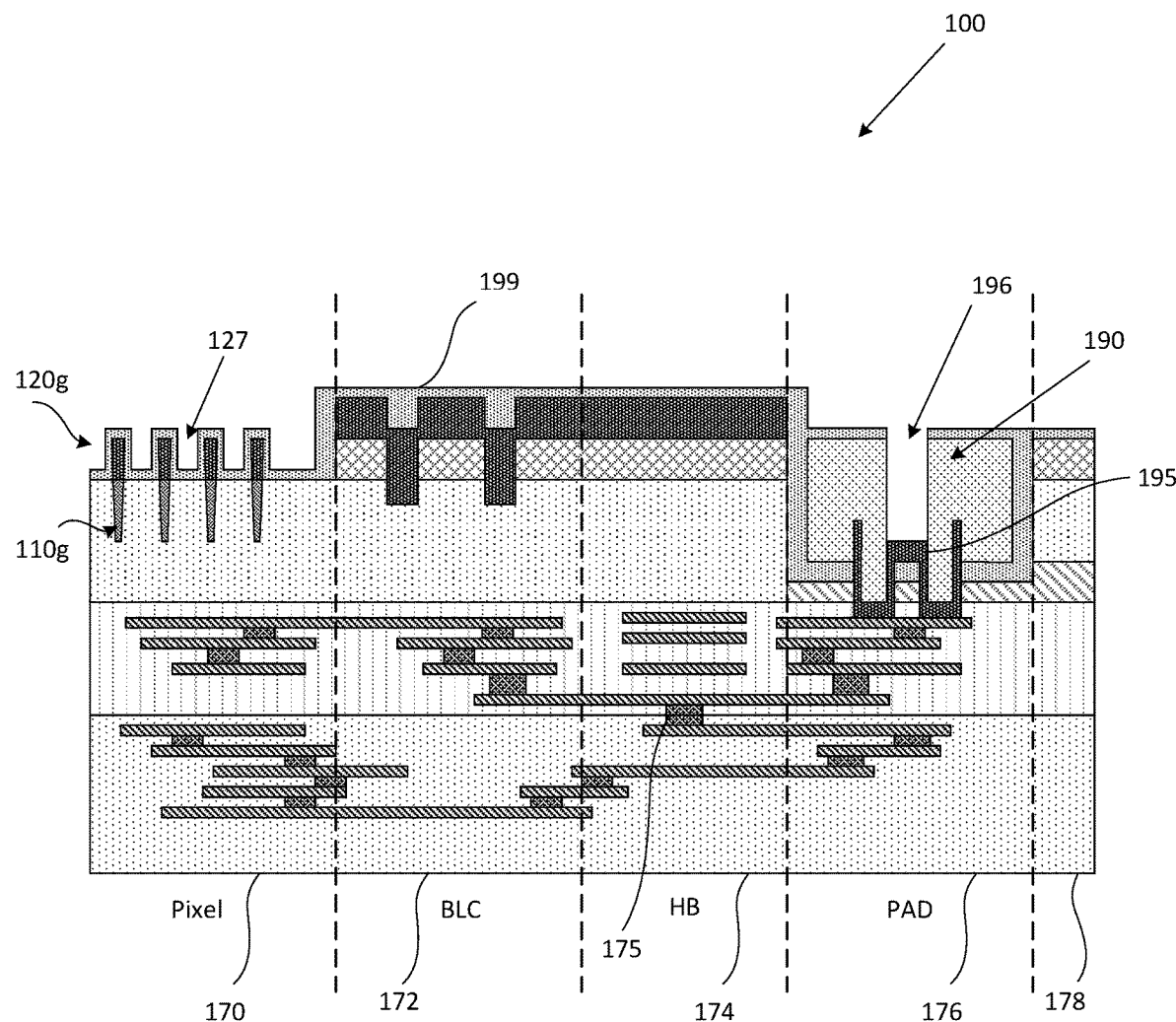

After the layer of photoresists 193 in FIG. 7I is stripped off, a BSI image sensor package 100 as shown in FIG. 7J is obtained. The BSI image sensor package 100 has a pixel region 170 where the array of pixel sensors 102 arranged in rows and columns are located. The photodiodes in the pixel sensors are optically isolated from each other with the trench isolation grid 110*g*. The metallic grid 120*g* is formed over the trench isolation grid 110*g*. The trench isolation grid 110*g* includes trench isolation grid segments 110 arranged in rows and columns, and the metallic grid 120*g* includes metallic grid segments 120 arranged in rows and columns. Given a selected pixel sensor 102, a metallic grid segment 120 in this selected pixel sensor 102 is aligned with and in direct contact with its corresponding trench isolation grid segment 110.

In the device structure as shown in FIG. 7J, color filters and micro lenses can be positioned within the interior regions 127 of metallic grid segments 120. Additionally, the BSI image sensor package 100 of FIG. 7J can be electrically connected to other electrical components by connecting these components to the contact pads, for example, by connecting to the top metal contact 195 in the contact pad 191 through the contact opening 196.

In some embodiments, the present application provides a method including: depositing a first dielectric layer over a back surface of a substrate that has a plurality of photodiodes formed therein; forming a grid of trenches, wherein a trench passes through the first dielectric layer and extends into the substrate; filling in the trenches with dielectric material to create a trench isolation grid; etching back dielectric material in the trenches to a level that is below an upper surface of the first dielectric layer to form recesses overlaying the trench isolation grid; and filling in the recesses with metallic material to create a metallic grid that is aligned with the trench isolation grid. In some embodiments, the method further includes removing at least part of the first dielectric layer to expose at least part of an interior region of metallic grid segments in the metallic grid. In some embodiments, the method further includes removing at least part of the first dielectric layer and at least part of the substrate, to expose at least part of interior region of metallic grid segments in the metallic grid, until a bottom of the metallic grid is vertically separated from a surface of the substrate by a predetermined distance. In some embodiments, forming the grid of trenches includes: depositing a layer of silicon nitride over the first dielectric layer; forming a mask pattern in the layer of silicon nitride; and etching through the first dielectric layer and etching into the substrate according to the mask pattern in the layer of silicon nitride. In some embodiments, the method further includes forming a high absorption structure in a part of the back surface of the substrate, wherein the first dielectric layer is deposited on the high absorption structure in the part of the back surface of the substrate. In some embodiments, the method further includes removing at least part of the first dielectric layer until a surface of the high absorption structure is exposed. In some embodiments, the first dielectric layer includes a layer of oxide. In some embodiments, the metallic material includes tungsten. In some embodiments, the method further includes depositing a layer of high-k dielectric material over the back surface of the substrate, wherein the first dielectric layer is deposited on the layer of high dielectric material. In some embodiments, the method further includes lining inner surfaces of the recesses with a barrier layer before filling in the recesses with the metallic material.

In some embodiments, the present application provides a device including: a substrate having a plurality of photodiodes formed therein; a trench isolation grid having trench isolation grid segments embedded in the substrate, wherein a trench isolation grid segment laterally surrounds a photodiode; and a metallic grid having metallic grid segments formed over the trench isolation grid, wherein a metallic grid segment is aligned with and in direct contact with the trench isolation grid segment at an interface between the metallic grid segment and the trench isolation grid segment, and wherein a cross section of the metallic grid segment at the interface is identical to a cross section of the trench isolation grid segment at the interface. In some embodiments, the device further includes: a high absorption structure in at least a part of a backside surface of the substrate; and a dielectric layer covering the backside surface of the substrate. In some embodiments, the interface between the metallic grid segment and the trench isolation grid segment is vertically separated from a surface of the substrate by a predetermined distance. In some embodiments, the trench isolation grid includes a deep trench isolation grid that includes deep trench isolation grid segments. In some embodiments, the trench isolation grid includes a dielectric grid that includes dielectric grid segments.

In some embodiments, the present application provides another device including: a substrate including a photodetector; a DTI structure extending into a backside of the substrate and including a first DTI segment and a second DTI segment, wherein the photodetector is between the first and second DTI segments and borders the first DTI segment; and a conductive structure including a first conductive segment and a second conductive segment, wherein the first and second conductive segments respectively cover and directly contact the first and second DTI segments on the backside of the substrate; wherein the first DTI segment has a first DTI sidewall directly contacting the substrate and the first conductive segment has a first conductive sidewall aligned to the first DTI sidewall. In some embodiments, the backside of the substrate has a saw-toothed profile at the photodetector and is lined by a high k dielectric layer, wherein the high k dielectric layer has a top surface and a bottom surface both conforming to the saw-toothed profile, and wherein the high k dielectric layer has a high-k-dielectric sidewall directly contacting the first conductive sidewall. In some embodiments, the high-k-dielectric sidewall directly contacts the first DTI sidewall. In some embodiments, the first DTI segment has a second DTI sidewall on an opposite side of the first DTI segment as the first DTI sidewall, wherein the first conductive segment has a second conductive sidewall on an opposite side of the first conductive segment as the first conductive sidewall, and wherein the second DTI sidewall and the second conductive sidewall are aligned to each other and arranged edge-to-edge. In some embodiments, the substrate further includes a second photodetector neighboring the photodetector, wherein the second DTI segment is between the photodetector and the second photodetector, and wherein the second DTI segment and the second conductive segment share a common width at an interface at which the second DTI segment and the second conductive segment directly contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first dielectric layer over a back surface of a substrate that has a plurality of photodiodes formed therein;
forming a grid of trenches, wherein a trench passes through the first dielectric layer and extends into the substrate;
filling in the trenches with a dielectric material to create a trench isolation grid;
etching back the dielectric material in the trenches to a level that is below an upper surface of the first dielectric layer to form recesses overlaying the trench isolation grid; and
filling in the recesses with a metallic material to create a metallic grid that is aligned with the trench isolation grid.

2. The method of claim 1, further comprising:
removing at least part of the first dielectric layer to expose at least part of an interior region of metallic grid segments in the metallic grid.

3. The method of claim 1, further comprising:
removing at least part of the first dielectric layer and at least part of the substrate, to expose at least part of an interior region of metallic grid segments in the metallic grid, until a bottom of the metallic grid is vertically separated from a surface of the substrate by a predetermined distance.

4. The method of claim 1, wherein forming the grid of trenches comprises:
depositing a layer of silicon nitride over the first dielectric layer;
forming a mask pattern in the layer of silicon nitride; and
etching through the first dielectric layer and etching into the substrate according to the mask pattern in the layer of silicon nitride.

5. The method of claim 1, further comprising:
forming a high absorption structure in a part of the back surface of the substrate, wherein the first dielectric layer is deposited on the high absorption structure in the part of the back surface of the substrate.

6. The method of claim 5, further comprising:
removing at least part of the first dielectric layer until a surface of the high absorption structure is exposed.

7. The method of claim 1, wherein the first dielectric layer comprises a layer of oxide.

8. The method of claim 1, wherein the metallic material comprises tungsten.

9. The method of claim 1, further comprising:
depositing a layer of high-k dielectric material over the back surface of the substrate, wherein the first dielectric layer is deposited on the layer of high-k dielectric material.

10. The method of claim 1, further comprising:
lining inner surfaces of the recesses with a barrier layer before filling in the recesses with the metallic material.

11. A method comprising:
depositing a dielectric layer overlying a photodiode in a substrate;
performing a first etch into the dielectric layer and the substrate to form a first trench and a second trench bordering the photodiode respectively on opposite sides of the photodiode, wherein the dielectric layer and the substrate define a common sidewall in the first trench;
forming a trench isolation structure in the first and second trenches and directly contacting the common sidewall; and
forming a conductive grid structure overlying the trench isolation structure in the first and second trenches and directly contacting the common sidewall.

12. The method of claim 11, wherein the forming of the conductive grid structure comprises:
depositing a conductive barrier layer lining the first and second trenches over the trench isolation structure; and
depositing a metallic layer filling the first and second trenches over the conductive barrier layer.

13. The method of claim 11, further comprising:
depositing a high-k dielectric layer overlying the photodiode, wherein the dielectric layer is deposited over the high-k dielectric layer, wherein the first etch is also performed into the high-k dielectric layer, and wherein the high-k dielectric layer partially defines the common sidewall.

14. The method of claim 11, wherein the common sidewall has a planar profile.

15. The method of claim 11, further comprising:
depositing a hard mask layer overlying the dielectric layer, wherein the first etch is performed with the hard mask layer in place, wherein the hard mask layer partially defines the common sidewall, and wherein the forming of the conductive grid structure comprises a planarization that planarizes a top surface of the conductive grid structure and removes the hard mask layer.

16. A method comprising:
depositing a dielectric layer overlying a photodiode in a substrate;
performing a first etch into the dielectric layer and the substrate to form a grid of trenches surrounding the photodiode;
forming a trench isolation structure partially filling the trenches;
depositing a conductive layer partially filling the trenches over the trench isolation structure, wherein the conductive layer comprises: a conductive barrier layer lining the trenches; and a metallic layer overlying the conductive barrier layer; and
performing a planarization into the conductive layer, including into the conductive barrier layer and the metallic layer, to recess a top surface of the conductive layer so the top surface of the conductive layer is level with a top surface of the dielectric layer.

17. The method of claim 16, further comprising:
performing a second etch into the dielectric layer to recess the top surface of the dielectric layer relative to the top surface of the conductive layer after the planarization.

18. The method of claim 16, wherein the forming of the trench isolation structure comprises:
depositing a dielectric material filling the trenches; and
performing a second etch into the dielectric material to recess a top surface of the dielectric material relative to the top surface of the dielectric layer.

19. The method of claim 16, further comprising:
depositing a high-k dielectric layer overlying the photodiode and having a top and a bottom both with sawtoothed profiles, wherein the dielectric layer is deposited over the high-k dielectric layer, and wherein the first etch is also performed into the high-k dielectric layer to form the trenches extending through the high-k dielectric layer.

20. The method of claim 16, wherein the conductive layer and the trench isolation structure share a common width in the trenches.

* * * * *